(12) United States Patent
Bhutta

(10) Patent No.: US 9,697,991 B2
(45) Date of Patent: Jul. 4, 2017

(54) RF IMPEDANCE MATCHING NETWORK

(71) Applicant: Reno Technologies, Inc., Wilmington, DE (US)

(72) Inventor: Imran Ahmed Bhutta, Moorestown, NJ (US)

(73) Assignee: Reno Technologies, Inc.

( * ) Notice: Subject to any disclaimer, the term of this patent is extended or adjusted under 35 U.S.C. 154(b) by 0 days.

(21) Appl. No.: 14/788,888

(22) Filed: Jul. 1, 2015

(65) Prior Publication Data

US 2015/0303033 A1  Oct. 22, 2015

Related U.S. Application Data

(63) Continuation-in-part of application No. 14/622,879, filed on Feb. 15, 2015, which is a continuation-in-part of application No. 14/616,884, filed on Feb. 9, 2015, which is a continuation-in-part of application No. 14/594,262, filed on Jan. 12, 2015.

(60) Provisional application No. 61/925,974, filed on Jan. 10, 2014, provisional application No. 61/940,165, filed on Feb. 14, 2014, provisional application No. 61/940,139, filed on Feb. 14, 2014, provisional application No. 62/019,591, filed on Jul. 1, 2014.

(51) Int. Cl.
*H01L 21/02* (2006.01)
*H01J 37/32* (2006.01)

(52) U.S. Cl.
CPC .............................. *H01J 37/32183* (2013.01)

(58) Field of Classification Search
CPC ..................... H01L 21/02274; H01J 37/32183
See application file for complete search history.

(56) References Cited

U.S. PATENT DOCUMENTS

| | | | |
|---|---|---|---|
| 4,110,700 A | 8/1978 | Rosen et al. |
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,654,679 A | 8/1997 | Mavretic et al. |
| 5,815,047 A | 9/1998 | Sorensen et al. |

(Continued)

FOREIGN PATENT DOCUMENTS

| | | |
|---|---|---|
| EP | 0840349 | 5/1998 |
| EP | 0840350 | 5/1998 |
| WO | 2006096589 | 9/2006 |

*Primary Examiner* — Whitney T Moore
*Assistant Examiner* — Joseph Galvin, III
(74) *Attorney, Agent, or Firm* — The Belles Group, P.C.

(57) ABSTRACT

An RF matching network includes a control circuit configured to instruct at least one EVC to alter its variable capacitance, the alteration of the variable capacitance causing the matching network to achieve a preliminary match state, the preliminary match state having an associated first reflection parameter value at an RF source output; and upon the achievement of the preliminary match state, instruct an RF source to alter a variable RF source frequency, the alteration of the variable RF source frequency causing achievement of a final match state, the final match state having an associated second reflection parameter value at the RF source output; wherein the second reflection parameter value is less than the first reflection parameter value.

20 Claims, 13 Drawing Sheets

(56) References Cited

U.S. PATENT DOCUMENTS

| | | |
|---|---|---|
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,400,012 B1 | 6/2002 | Miller et al. |
| 6,424,232 B1 | 7/2002 | Mavretic et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,852,170 B2 | 12/2010 | McKinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | Mckinzie, III |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | Mckinzie, III |
| 8,217,732 B2 | 7/2012 | Mckinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | Mckinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | Mckinzie, III |
| 8,559,907 B2 | 10/2013 | Burgener et al. |
| 8,564,381 B2 | 10/2013 | Mckinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 2002/0060914 A1 | 5/2002 | Porter et al. |
| 2003/0007372 A1 | 1/2003 | Porter et al. |
| 2003/0046013 A1 | 3/2003 | Gerrish |
| 2003/0097984 A1* | 5/2003 | Nakano ............ H01J 37/32082 118/712 |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0039194 A1* | 2/2010 | Darabi ................ H03B 5/364 334/55 |
| 2010/0073104 A1 | 3/2010 | Cotter et al. |
| 2010/0123502 A1 | 5/2010 | Bhutta et al. |
| 2010/0194195 A1* | 8/2010 | Coumou ........... H01J 37/32082 307/24 |
| 2010/0201370 A1 | 8/2010 | Coumou et al. |
| 2010/0231296 A1 | 9/2010 | Nagarkatti et al. |
| 2010/0259302 A1* | 10/2010 | Shrivastava ......... G11C 27/024 327/95 |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |

(56) References Cited

U.S. PATENT DOCUMENTS

| | | |
|---|---|---|
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |

\* cited by examiner

RF IMPEDANCE MATCHING NETWORK

CROSS REFERENCE TO RELATED APPLICATIONS

The present application is a continuation in part of U.S. patent application Ser. No. 14/622,879, filed Feb. 15, 2015, which (a) is a continuation in part of U.S. patent application Ser. No. 14/616,884, filed Feb. 9, 2015, which is a continuation in part of U.S. patent application Ser. No. 14/594,262, filed Jan. 12, 2015, which in turn claims priority to U.S. Provisional Patent Application Ser. No. 61/925,974, filed Jan. 10, 2014, and (b) claims priority to U.S. Provisional Patent Application Ser. No. 61/940,165, filed Feb. 14, 2014. U.S. patent application Ser. No. 14/616,884, filed Feb. 9, 2015, also claims priority to U.S. Provisional Patent Application Ser. No. 61/940,139, filed Feb. 14, 2014. The present application also claims priority to U.S. Provisional Patent Application Ser. No. 62/019,591, filed Jul. 1, 2014. The disclosures of these references are incorporated herein by reference in their entireties.

FIELD OF THE INVENTION

The field of the present invention relates to RF matching networks, including RF matching networks that may be used with plasma chambers in the fabrication of semiconductor devices.

BACKGROUND OF THE INVENTION

The semiconductor device fabrication process uses plasma processing at different stages to make semiconductor devices. Such devices may include microprocessors, memory chips, and other integrated circuits and devices. Plasma processing involves energizing a gas mixture by imparting energy to the gas molecules by introducing RF (radio frequency) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as an RF matching network.

The purpose of the RF matching network is to transform the variable plasma impedance to a value that more closely matches the fixed impedance of the RF generator. In many cases, particularly in semiconductor fabrication processes, the system impedance of the RF generator is fixed at 50 Ohms, and RF power is transmitted through coaxial cables which also have a fixed impedance of 50 Ohms. Unlike the impedance of the RF generator and the coaxial cables, the impedance of the plasma, which is driven by the RF power, varies. In order to effectively transmit RF power from the RF generator and the coaxial cables to the plasma chamber, the impedance of the plasma chamber must be transformed to non-reactive 50 Ohms (i.e., 50+j0). Doing so will help maximize the amount of RF power transmitted into the plasma chamber.

The typical RF matching network includes variable capacitors and a control circuit with a microprocessor to control the capacitance values of the variable capacitors. Although several different configurations for RF matching networks are known, for simplicity, the remainder of the description will be in the context of one form of 'L' type RF matching network, with the understanding that one of skill in the art may apply the same principles to other types of RF matching networks.

The value and size of the variable capacitors within the RF matching network are determined by the power handling capability, frequency of operation, and impedance range of the plasma chamber. The predominant type of variable capacitor used in RF matching network applications is a Vacuum Variable Capacitor (VVC). The VVC is an electromechanical device, having two concentric metallic rings that are moved in relation to each other to change capacitance. In complex semiconductor fabrication processes using plasma chambers, where the impedance changes are often frequent, the frequent adjustments needing to be made to a VVC leads to mechanical failures, often within less than a year of use for individual VVCs. Failure of a VVC leads to downtime for fabrication equipment so that the failed VVC can be replaced. Due to a desire to eliminate points of mechanical failure in the semiconductor fabrication process, it is unsurprising that the VVCs in RF matching networks are one of the last electromechanical components that remain in wide use in the semiconductor fabrication process.

As semiconductor devices shrink in size and become more complex, the feature geometries become very small. As a result, the processing time for each individual step needed to fabricate these small features has likewise been reduced—typically in the range of 5~6 s. RF matching networks which use VVCs generally take in the range of 1~2 s to match the plasma chamber impedance to the RF generator impedance. During a significant amount of the matching process, which includes the microprocessor determining the capacitances for the VVCs needed to create the match, controlling the VVCs to the achieve the determined capacitances, and then finally time for the RF matching network circuits to stabilize with the new capacitances, the fabrication process parameters are unstable, and these unstable process parameters must be accounted for as part of the overall fabrication process. Because the matching process time is becoming a more and more significant part of the time for each fabrication process step, the period in which process parameters are unstable becomes more of a factor in the overall fabrication process.

While Electronically Variable Capacitor (EVC) technology is known (see U.S. Pat. No. 7,251,121, the disclosure of which is incorporated herein by reference in its entirety), it has yet to be developed into an industry-accepted replacement for VVCs. However, because an EVC is purely an electronic device, an EVC is not a one-for-one replacement for a VVC in an RF matching network. Further advancements are therefore needed to more fully take advantage of using EVCs as part of an RF matching network.

SUMMARY OF THE INVENTION

The present invention is directed toward systems and methods for providing impedance matching. In a first separate aspect of the present invention, an RF matching network includes an RF input configured to receive an RF signal from an RF source; an RF output configured to operably couple to a plasma chamber; at least one electronically variable capacitor (EVC) having a variable capacitance; a control circuit configured to: instruct the at least one EVC to alter the variable capacitance, the alteration of the variable capacitance causing the matching network to achieve a preliminary match state, the preliminary match state having an associated first reflection parameter value at an RF source output; and upon the achievement of the preliminary match state, instruct the RF source to alter a variable RF source frequency, the alteration of the variable RF source frequency causing achievement of a final match state, the final match state having an associated second reflection parameter value at the RF source output; wherein the second reflection parameter value is less than the first reflection parameter value.

In a second aspect of the present invention, a method of impedance matching includes operably coupling an RF source to an impedance matching network; operably coupling the matching network to a plasma chamber; altering a variable capacitance of at least one electronically variable capacitor (EVC) of the matching network, the alteration of the variable capacitance causing achievement of a preliminary match state, the preliminary match state having an associated first reflection parameter value at an RF source output; and upon the achievement of the preliminary match state, altering a variable RF source frequency of the RF source, the alteration of the variable RF source frequency causing a final match state, the final match state having an associated second reflection parameter value at the RF source output; wherein the second reflection parameter value is less than the first reflection parameter value.

In a third aspect of the present invention, an RF source includes an RF source output configured to provide an RF signal to an impedance matching network, the matching network configured to operably couple to a plasma chamber; an input configured to receive a first signal indicating that the matching network has achieved a preliminary match state, the preliminary match state having an associated first reflection parameter value at the RF source output; and a frequency generation circuit configured to alter a variable RF source frequency, the alteration of the variable RF source frequency causing achievement of a final match state, the final match state having an associated second reflection parameter value at the RF source output; wherein the second reflection parameter value is less than the first reflection parameter value.

In a fourth aspect of the present invention, a method of manufacturing a semiconductor includes placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma: operably coupling the RF source to an impedance matching network; operably coupling the matching network to the plasma chamber; altering a variable capacitance of at least one electronically variable capacitor (EVC) of the matching network, the alteration of the variable capacitance causing achievement of a preliminary match state, the preliminary match state having an associated first reflection parameter value at an RF source output; and upon the achievement of the preliminary match state, altering a variable RF source frequency of the RF source, the alteration of the variable RF source frequency causing a final match state, the final match state having an associated second reflection parameter value at the RF source output; wherein the second reflection parameter value is less than the first reflection parameter value.

Accordingly, an improved matching network, along with systems and methods incorporating same, is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

Figure 1:
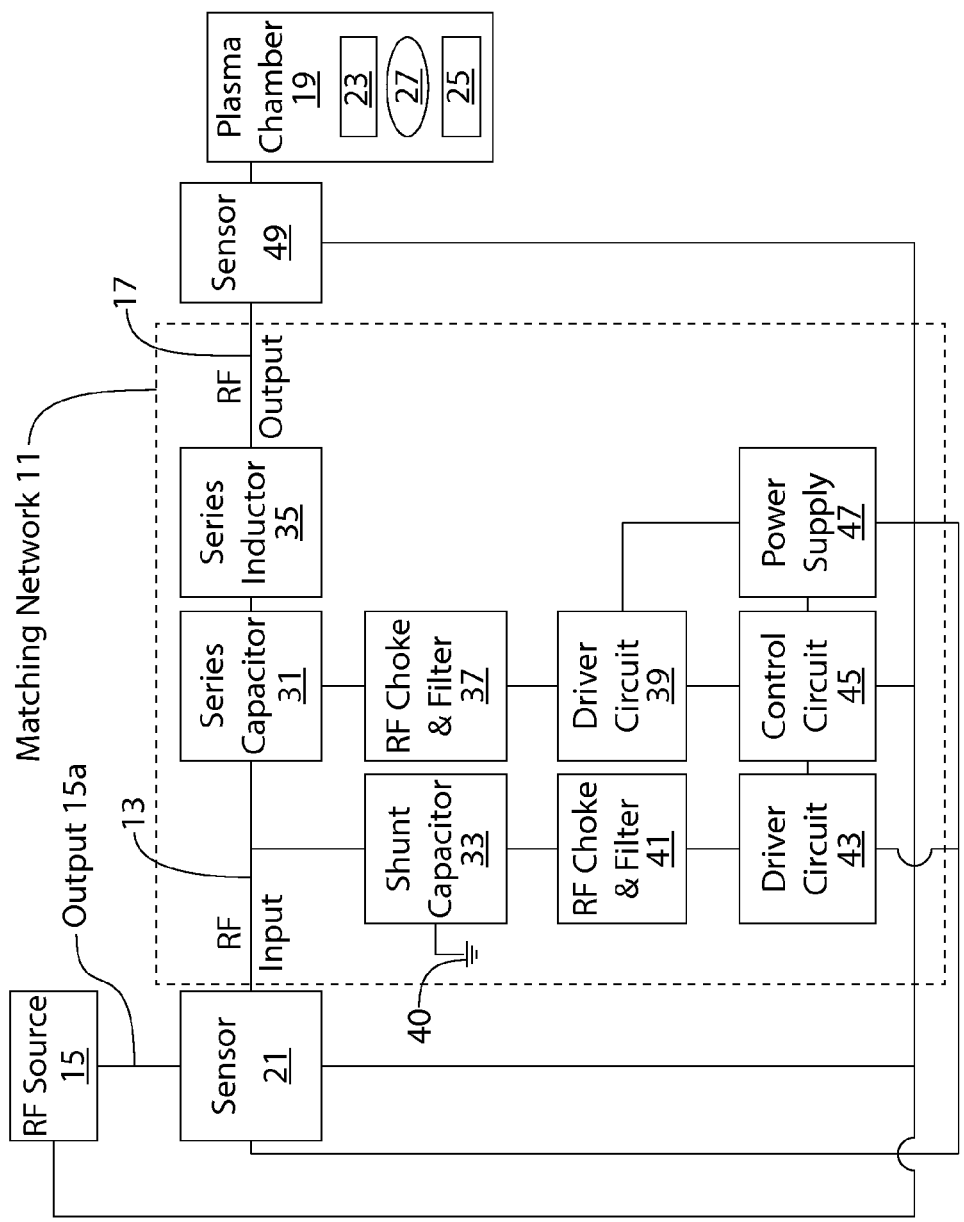
FIG. 1 is a schematic representation of an embodiment of an RF impedance matching network using EVCs incorporated into a semiconductor wafer fabrication system.

Turning in detail to the drawings, FIG. 1 illustrates an RF impedance matching network 11 having an RF input 13 connected to an RF source 15 and an RF output 17 connected to a plasma chamber 19. An RF input sensor 21 is connected between the RF impedance matching network 11 and the RF source 15 so that the RF signal output from the RF source 15 may be monitored. An RF output sensor 49 is connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

The RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

The RF impedance matching network 11 includes a series variable capacitor 31, a shunt variable capacitor 33, and a series inductor 35 configured as one form an 'L' type matching network. In particular, the shunt variable capacitor 33 is shown shunting to ground 40 between the series variable capacitor 31 and the series inductor 35, and one of skill in the art will recognize that the RF impedance matching network 11 may be configured with the shunt variable capacitor 33 shunting to ground 40 at the RF input 13 or at the RF output 17. Alternatively, the RF impedance matching network 11 may be configured in other matching network configurations, such as a 'T' type configuration or a 'Pi' or 'Π' type configuration. For example, in a Pi matching network, the series capacitor 31 can be replaced with a second shunt capacitor located after the series inductor, with one end of the second shunt capacitor coupled to the output 17 and the other end coupled to ground. In certain other embodiments, the variable capacitors and the switching circuit described below may be included in any configuration appropriate for an RF impedance matching network.

Each of the series variable capacitor 31 and the shunt variable capacitor 33 may be an electronic variable capacitor (EVC), as described in U.S. Pat. No. 7,251,121. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. As used herein, the term "electronically variable capacitor" and its abbreviation "EVC" shall refer to a purely electronic device that switches ON and OFF capacitance-providing components to vary the total capacitance provided. The term shall not refer to mechanically variable capacitors such as vacuum variable capacitors.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device, such as a computer or microprocessor, configured for executing computer program instructions (e.g. code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

The series and shunt variable capacitors 31, 33 may each be an electronically variable capacitor 51 such as is depicted in FIG. 2. The electronically variable capacitor 51 includes a plurality of discrete capacitors 53, each of which has an electrode on opposite sides thereof, such as is typical of discrete capacitors that are available on the market.

Each discrete capacitor 53 has its individual bottom electrode 55 electrically connected to a common bottom electrode 57. The individual top electrode 59 of each discrete capacitor 53 is electrically connected to the individual top electrode 59 of adjacent discrete capacitors 53 through an electronic switch 61 that may be activated to electrically connect the adjacent top electrodes 59. Thus, the individual top electrodes 59 of each discrete capacitor 53 may be electrically connected to the top electrodes 59 of one or more adjacent discrete capacitors 53. The electronic switch 61 is selected and/or designed to be capable of switching the voltage and current of the RF signal. For example, the electronic switch 61 may be a PiN/NiP diode, or a circuit based on a PiN/NiP diode. Alternatively, the electronic switch 61 may be any other type of appropriate switch, such as a micro electro mechanical (MEM) switch, a solid state relay, a field effect transistor, and the like. One embodiment of the electronic switch 61, in combination with a driver circuit, is discussed in greater detail below.

In the configuration of the electronically variable capacitor 51 shown, each individual top electrode 59 may be electrically connected to between two to four adjacent top electrodes 59, with each connection being independently regulated by a separate electronic switch 61. The RF signal input 63 is electrically connected to one of the individual top electrodes 59, and the RF signal output 65 is electrically connected to the common bottom electrode 57. Thus, the electronic circuit through which the RF signal passes may include one, some, or all of the discrete capacitors 53 by a process of independently activating one or more of the electronic switches 61 coupled to adjacent ones of the individual top electrodes 59.

In other embodiments, the electronically variable capacitor 51 may be configured to have any layout for the individual top electrodes 59, to thereby increase or decrease the number of possible electrical connections between adjacent top electrodes 59. In still other embodiments, the electronically variable capacitor 51 may have an integrated dielectric disposed between the bottom electrode 57 and a plurality of top electrodes 59.

The electronic switch 61 that is used to connect pairs of adjacent top electrodes 59 may be a PiN/NiP diode-based switch, although other types of electronic switches may be used, such as a Micro Electro Mechanical (MEM) switch, a solid state relay, a field effect transistor, and the like. Each electronic switch 61 is switched by appropriate driver circuitry. For example, each of the series and 651 shunt driver circuits 39, 43 of FIG. 1 may include several discrete driving circuits, with each discrete driving circuit configured to switch one of the electronic switches 61.

Figure 2A:
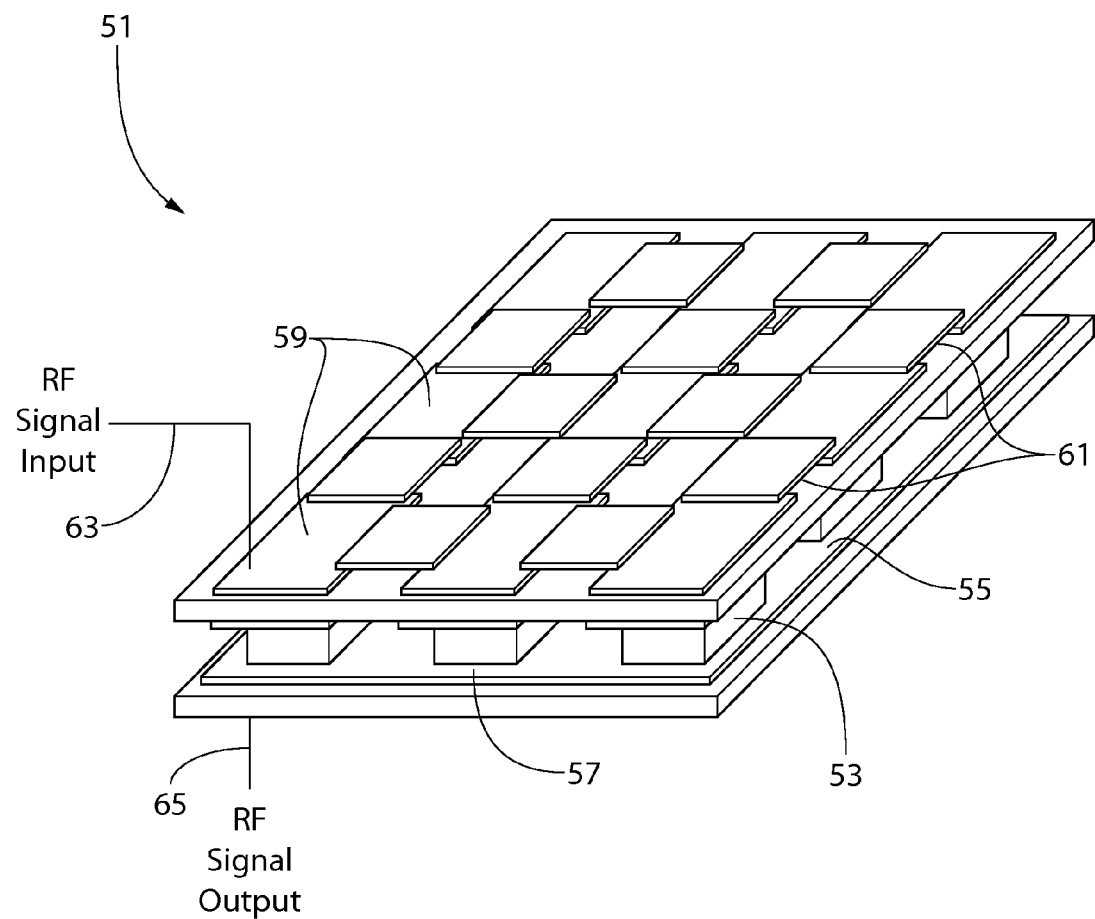
FIG. 2A illustrates an EVC for use in an RF impedance matching network.
Figure 2B:
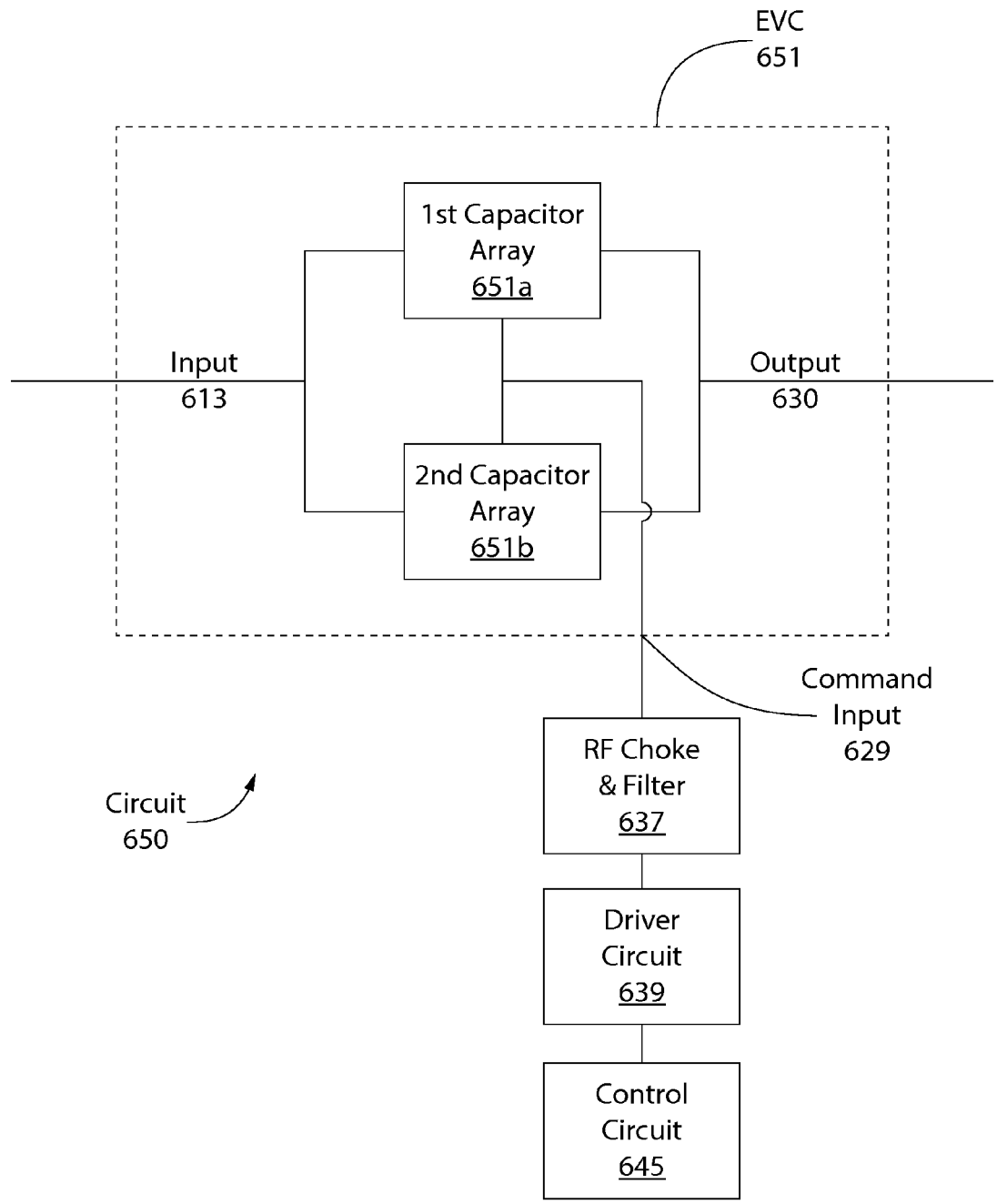
FIG. 2B is a schematic representation of an embodiment of an electronic circuit for providing a variable capacitance.

FIG. 2B shows an electronic circuit 650 for providing a variable capacitance according to one embodiment. The circuit 650 utilizes an EVC 651 that includes two capacitor arrays 651a, 651b. The first capacitor array 651a has a first plurality of discrete capacitors, each having a first capacitance value. The second capacitor array 651b has a second plurality of discrete capacitors, each having a second capacitance value. The first capacitance value is different from the second capacitance value such that the EVC 651 can provide coarse and fine control of the capacitance produced by the EVC 651. The first capacitor array and the second capacitor array are coupled in parallel between a signal input 613 and a signal output 630. The capacitor arrays 651a, 651b and their discrete capacitors may be arranged in manner similar to that shown in FIG. 2A, or in an alternative manner.

The first and second capacitance values can be any values sufficient to provide the desired overall capacitance values for the EVC 651. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 650 further includes a control circuit 645. The control circuit 645 is operably coupled to the first capacitor array 651a and to the second capacitor array 651b by a command input 629, the command input 629 being operably coupled to the first capacitor array 651a and to the second capacitor array 651b. In the exemplified embodiment, the command input 629 has a direct electrical connection to the capacitor arrays 651a, 651b, though in other embodiments this connection can be indirect. The coupling of the control circuit 645 to the capacitor arrays 651*a*, 651*b* will be discussed in further detail below.

The control circuit 645 is configured to alter the variable capacitance of the EVC 651 by controlling on and off states of (a) each discrete capacitor of the first plurality of discrete capacitors and (b) each discrete capacitor of the second plurality of discrete capacitors. The control circuit 645 can have features similar to those described with respect to control circuit 45 of FIG. 1. For example, the control circuit 645 can receive inputs from the capacitor arrays 651*a*, 651*b*, make calculations to determine changes to capacitor arrays 651*a*, 651*b*, and delivers commands to the capacitor arrays 651*a*, 651*b* for altering the capacitance of the EVC 651.

Figure 2C:
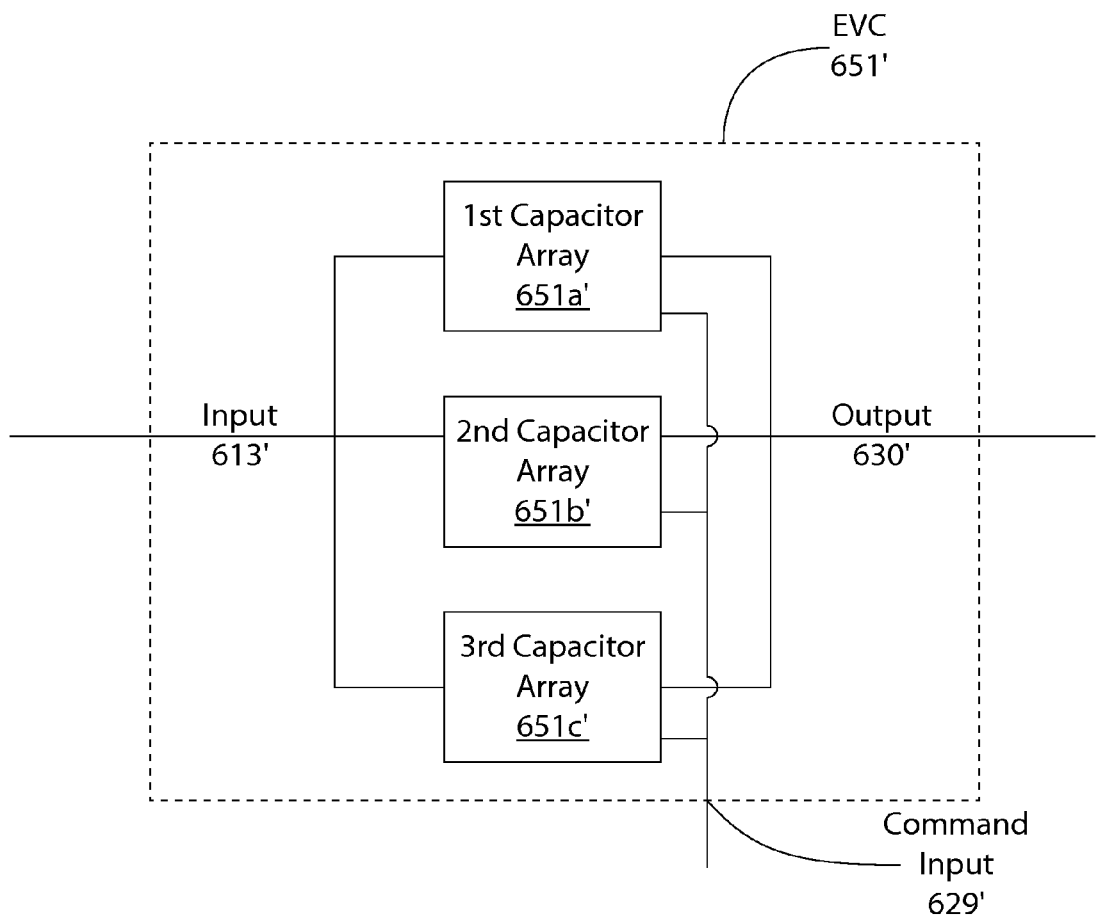
FIG. 2C is a schematic representation of an embodiment of an EVC having three capacitor arrays.

Similar to EVC 51 discussed with respect to FIG. 2A, the EVC 651 of FIGS. 2B and 2C can include a plurality of electronic switches. Each electronic switch can be configured to activate and deactivate one or more discrete capacitors.

As with the control circuit 45 of FIG. 1, the control circuit 645 can also be connected to a driver circuit 639 and an RF choke and filter circuit 637. The control circuit 645, driver circuit 639, and RF choke and filter circuit 637 can have capabilities similar to those discussed with regard to FIG. 1. In the exemplified embodiment, the driver circuit 639 is operatively coupled between the control circuit 645 and the first and second capacitor arrays 651*a*, 651*b*. The driver circuit 639 is configured to alter the variable capacitance based upon a control signal received from the control circuit 645. The RF filter 637 is operatively coupled between the driver circuit 639 and the first and second capacitor arrays 651*a*, 651*b*. In response to the control signal sent by the control unit 645, the driver circuit 639 and RF filter 637 are configured to send a command signal to the command input 629. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 639 is configured to switch a high voltage source on or off in less than 15 μsec, the high voltage source controlling the electronic switches of each of the first and second capacitor arrays for purposes of altering the variable capacitance. The EVC 651, however, can be switched by any of the means or speeds discussed in the present application.

The control circuit 645 can be configured to calculate coarse and fine capacitance values to be provided by the respective capacitor arrays 651*a*, 651*b*. In the exemplified embodiment, the control circuit 645 is configured to calculate a coarse capacitance value to be provided by controlling the on and off states of the first capacitor array 651*a*. Further, the control circuit is configured to calculate a fine capacitance value to be provided by controlling the on and off states of the second capacitor array 651*b*. In other embodiments, the capacitor arrays 651*a*, 651*b* can provide alternative levels of capacitance.

In other embodiments, the EVC can utilize additional capacitor arrays. FIG. 2C shows an embodiment of an EVC 651' in which a third capacitor array 651*c'* is utilized to provide an additional degree of control over the variable capacitance. Like the EVC 651 of FIG. 2B, the EVC 651' of FIG. 2C includes an input 613', an output 630', and a command input 629'. Similar to the first and second capacitor arrays 651*a'*, 651*b'*, the third capacitor array 651*c'* can have a third plurality of discrete capacitors. Each discrete capacitor of the third plurality of discrete capacitors can have a third capacitance value, this value being different from both the first capacitance value and the second capacitance value. The first capacitor array 651*a'*, second capacitor array 651*b'*, and third capacitor array 651*c'* can be coupled in parallel between the signal input 613' and the signal output 630'. A control circuit can be operably coupled to the third capacitor array 651*c'*, and be further configured to alter the variable capacitance by controlling on and off states of each discrete capacitor of the third plurality of discrete capacitors. Additional capacitor arrays enable an EVC to utilize several different capacitance values in controlling the overall EVC capacitance. In other embodiments, the third plurality of discrete capacitors can be replaced with a single discrete capacitor, or an alternative device for varying the overall capacitance of the EVC 651'.

The first, second, and third capacitance values of EVC 651' can be any values sufficient to provide the desired overall capacitance values for EVC 651'. In one embodiment, the second capacitance value is less than or equal to one-half (½) of the first capacitance value, and the third capacitance value is less than or equal to one-half (½) of the second capacitance value. In another embodiment, the second capacitance value is less than or equal to one-third (⅓) of the first capacitance value, and the third capacitance value is less than or equal to one-third (⅓) of the second capacitance value.

The EVCs 651, 651' of FIGS. 2B and 2C, respectively, can be used in most systems requiring a varying capacitance. For example, the EVCs 651, 651' can be used as a series EVC and/or a shunt EVC in a matching network, such as the RF matching network 11 discussed above with respect to FIG. 1. It is often desired that the differences between the capacitance values allow for both a sufficiently fine resolution of the overall capacitance of the circuit and a wide range of capacitance values to enable a better impedance match at the input of a RF matching network, and EVCs 651, 651' allow this.

The EVCs 651, 651' can also be used in a system or method for fabricating a semiconductor, a method for controlling a variable capacitance, and/or a method of controlling an RF impedance matching network. Such methods can include altering at least one of the series variable capacitance and the shunt variable capacitance to the determined series capacitance value and the shunt capacitance value, respectively. This altering can be accomplishing by controlling, for each of the series EVC and the shunt EVC, on and off states of each discrete capacitor of each plurality of discrete capacitors. In other embodiments, the EVC 651, 651' and circuit 650 can be used in other methods and systems to provide a variable capacitance.

Figure 3:
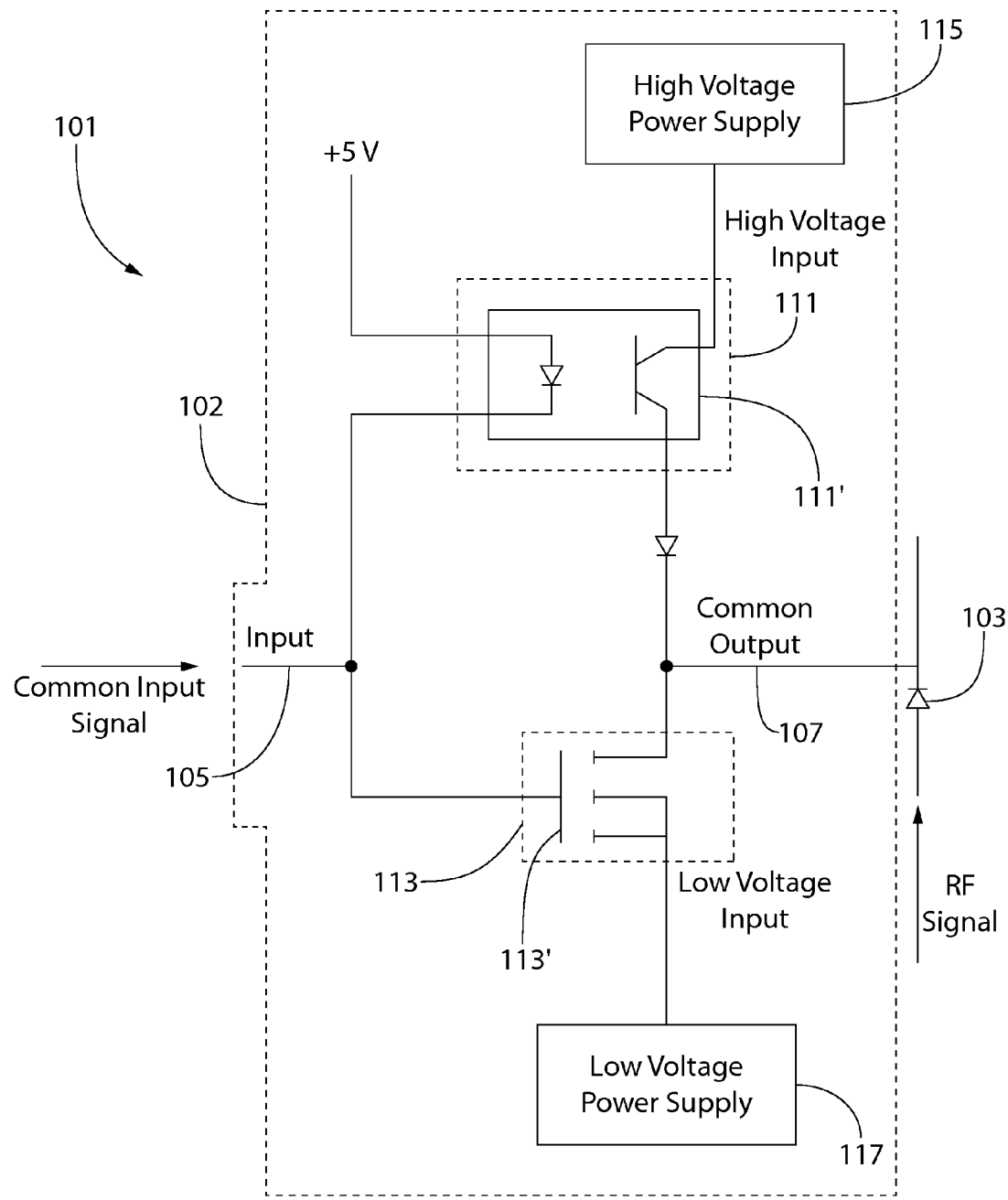
FIG. 3 illustrates a first switching circuit for use with an EVC.

FIG. 3 shows an embodiment of a high voltage switching circuit 101, which is shown including a driver circuit 102 and a PiN/NiP diode 103 as an electronic switch. Although this switching circuit is shown with the driver circuit 102 integrated with the PiN/NiP diode 103, one of skill in the art will understand that in practice, the PiN/NiP diode 103, or any other type of electronic switch, may be integrated with the discrete capacitors in an EVC that is part of an RF impedance matching network, with the RF choke and filter circuit connected between the output of the driver circuit 102 and the PiN/NiP diode 103.

The switching circuit 101 may be used for switching one of the discrete capacitors in an EVC between an 'ON' state and an 'OFF' state. One of skill in the art will recognize that the use of the PiN/NiP diode 103 in this embodiment is exemplary, and that the switching circuit 101 may include other types of circuitry that does not include the PiN/NiP diode 103, yet still provides some of the same fast switching advantages of the PiN/NiP diode 103 for switching one of the discrete capacitors in an EVC. One of skill in the art will also recognize that certain components of the driver circuit 102 may be replaced with other components that perform the same essential function while also greater allowing variability in other circuit parameters (e.g. voltage range, current range, and the like).

This driver circuit 102 has an input 105 which receives a common input signal for controlling the voltage on the common output 107 that is connected to and drives the PiN/NiP diode 103. The voltage on the common output 107 switches the PiN/NiP diode 103 between the 'ON' state and the 'OFF' state, thus also switching 'ON' and 'OFF' the discrete capacitor to which the PiN/NiP diode 103 is connected. The state of the discrete capacitor, in this exemplary embodiment, follows the state of the state of the PiN/NiP diode 103, such that when the PiN/NiP diode 103 is 'ON', the discrete capacitor is also 'ON', and likewise, when the PiN/NiP diode 103 is 'OFF', the discrete capacitor is also 'OFF'. Thus, statements herein about the state of the PiN/NiP diode 103 inherently describe the concomitant state of the connected discrete capacitor of the EVC.

The input 105 is connected to both a first power switch 111 and into a second power switch 113. As depicted, the first power switch 111 is an optocoupler phototransistor 111', and the second power switch 113 is a MOSFET 113'. A high voltage power supply 115 is connected to the first power switch 111, providing a high voltage input which is to be switchably connected to the common output 107. A low voltage power supply 117 is connected to the second power switch 113, providing a low voltage input which is also to be switchably connected to the common output 107. In the configuration of the driver circuit 102 shown, the low voltage power supply 117 may supply a low voltage input which is about –5 V. Such a low voltage, with a negative polarity, is sufficient to provide a forward bias for switching the PiN/NiP diode 103. For other configurations of the driver circuit 102, a higher or lower voltage input may be used, and the low voltage input may have a positive polarity, depending upon the configuration and the type of electronic switch being controlled.

The common input signal asynchronously controls the 'on' and 'off' states of the first power switch 111 and the second power switch 113, such that when the first power switch 111 is in the 'on' state, the second power switch 113 is in the 'off' state, and similarly, when the first power switch is in the 'off' state, the second power switch 113 is in the 'on' state. In this manner, the common input signal controls the first power switch 111 and the second power switch 113 to asynchronously connect the high voltage input and the low voltage input to the common output for purposes of switching the PiN/NiP diode 103 between the 'ON' state and the 'OFF' state.

The input 105 may be configured to receive any type of appropriate control signal for the types of switches selected for the first power switch 111 and the second power switch 113, which may be, for example, a +5 V control signal. Of course, to maintain simplicity of the overall driver circuit 102 and avoid incurring additional manufacturing costs, the first and second power switches 111, 113 are preferably selected so that they may directly receive the common input signal without requiring additional circuitry to filter or otherwise transform the common input signal.

The switching circuit 101 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the switching circuit 101 is that it provides the ability to switch the common output between voltage modes quickly, within the time frame of about 15 µsec or less. The simplicity of the switching circuit 101 should considerably reduce manufacturing costs, especially when compared to other circuits performing similar functionality, and it should also significantly reduce space requirements for the circuit, and again, especially as compared to other circuits performing similar functionality. These advantages make the switching circuit 101 particularly advantageous with the incorporated PiN/NiP diode 103.

One of the ways in which these advances are realized is the first power switch 111 being a monolithic circuit element, such as the optocoupler phototransistor 111'. A monolithic element reduces both cost and space requirements. When an optocoupler phototransistor 111' is used as the monolithic element, it can perform the necessary high voltage switching quickly, and it serves to isolate the high voltage input from the common input signal. Other, as yet unrealized advantages may also be present through the use of an optocoupler phototransistor 111'.

An optocoupler phototransistor 111' serves well as the first power switch 111 for use in conjunction with the PiN/NiP diode 103 because of the low current requirements for the PiN/NiP diode 103 when in the 'OFF' state. During the 'OFF' state, the PiN/NiP diode 103 is reverse biased, and thus non-conducting, and as such the 'OFF' state current requirement falls within the current handling capability of most optocoupler phototransistors. In addition, in implementations when one or both of the voltage requirements or the current requirements exceed the specifications for a single optocoupler phototransistor, additional optocoupler phototransistors may be added into the circuit in series or in parallel to increase the voltage and/or current handling capabilities of the switching circuit.

To further highlight the advantages of the switching circuit 101, its operation is detailed when the first power switch 111 is an optocoupler phototransistor 111' and the second power switch 113 is an appropriate MOSFET 113'. In this example, the common input signal may be a 5 V control signal which is alternated between a first voltage level and a second voltage level that serve to switch both the optocoupler phototransistor 111' and the MOSFET 113' between 'on' and 'off' states. The manner of implementing a 5 V control signal is well known to those of skill in the art.

When the PiN/NiP diode 103 is to be turned to the 'OFF' state, the optocoupler phototransistor 111' is turned to the 'on' state by applying the first voltage level from the common input signal across the photodiode inputs of the optocoupler phototransistor 111'. Turning the optocoupler phototransistor 111' to the 'on' state connects high voltage input to the common output 107, thereby reverse biasing the PiN/NiP diode 103. At the same time, during this 'OFF' state of the PiN/NiP diode 103, application of the first voltage level from the common input signal to the MOSFET 113' places the MOSFET 113' in the 'off' state, thereby disconnecting low voltage input from the common output 107.

When the PiN/NiP diode 103 is to be turned to the 'ON' state, the optocoupler phototransistor 111' is turned to the 'off' state by applying the second voltage level from the common input signal across the photodiode inputs of the optocoupler phototransistor 111'. Turning the optocoupler phototransistor 111' to the 'off' state disconnects high voltage input from the common output 107. At the same time, application of the second voltage level from the common input signal to the MOSFET 113' places the MOSFET 113' in the 'on' state, thereby connecting the low voltage input to the common output 107. With the MOSFET 113' in the 'on' state, and the optocoupler phototransistor 111' to the 'off' state, only the low voltage input is connected to the common output 107, so that the PiN/NiP diode 103 is forward biased and placed in the 'ON' state.

As indicated above, the optocoupler phototransistor 111' provides the advantage that the common input signal is electrically isolated, through the internal optical switch (not shown) of the optocoupler phototransistor 111', from the switched high voltage, thus alleviating the need to float the drive circuit (such as when a MOSFET is used to switch the high voltage). Use of the optocoupler phototransistor 111' provides the additional advantage that the driver circuit 102 can quickly switch the common output 107 between the high voltage input and the low voltage input, with the switching occurring within the time frame of about 15 μsec or less. This fast switching time helps reduce switching loss, thereby reducing stress on the PiN/NiP diode itself, and introduces improvements in the semiconductor fabrication process by reducing the amount of time it takes for the RF impedance matching network to create an impedance match between the RF source and the plasma chamber.

The use of optocoupler phototransistors in the driver circuit 102 also provides advantages for switching a high voltage input in the range of 500 V-1000 V. Higher or lower voltages may also be switched with this driver circuit 102. The high voltage input may therefore differ from the low voltage input by at least two or three orders of magnitude, or more. Advantageously, when the switching circuit 101 incorporates the PiN/NiP diode 103, the high voltage input and the low voltage input may have opposite polarities.

Figure 4:
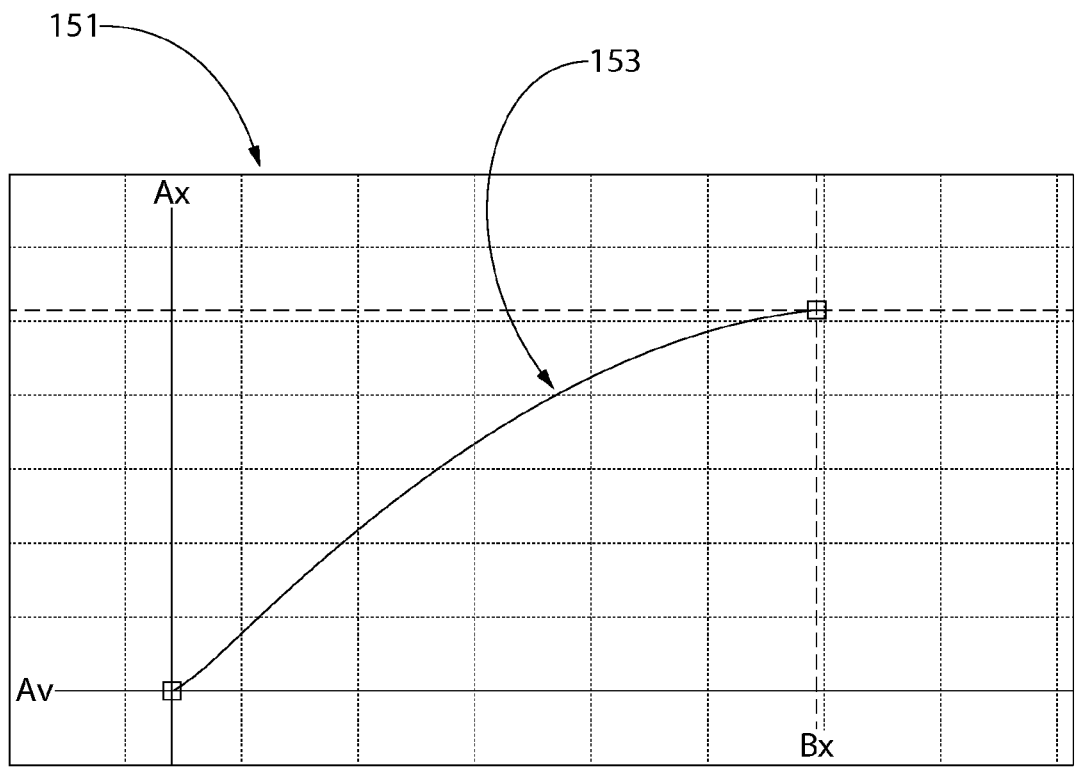
FIG. 4 is a graphical representation showing the timing capabilities of a driver circuit to switch to high voltage on the common output.
Figure 5:
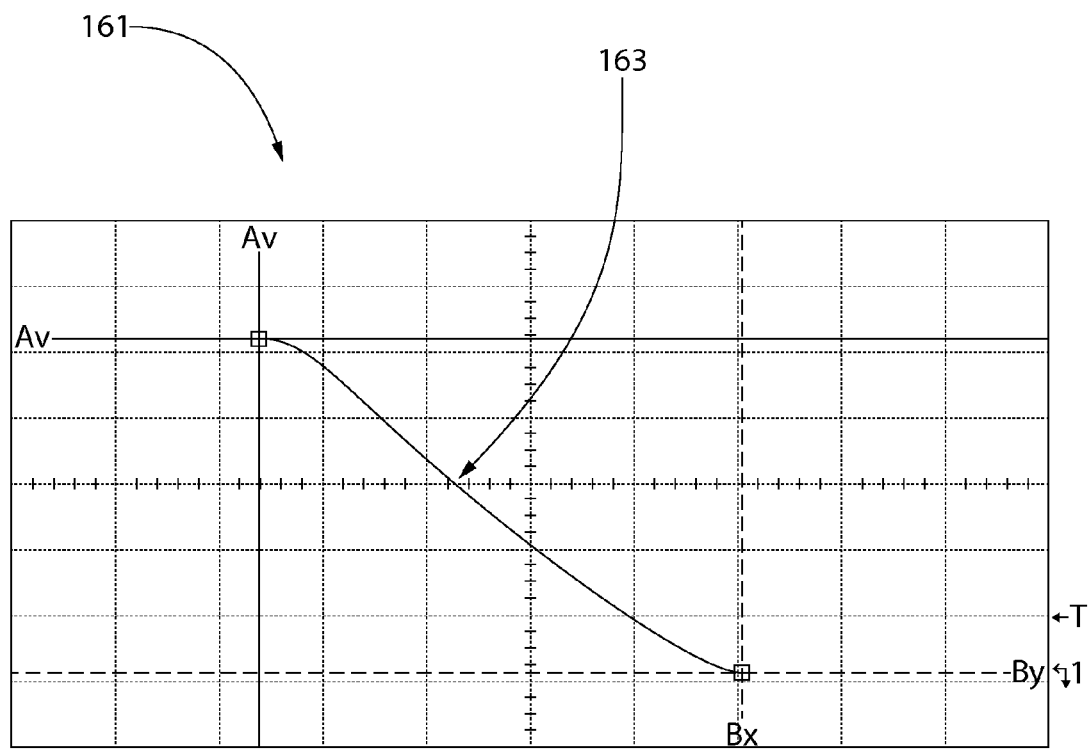
FIG. 5 is a graphical representation showing the timing capabilities of a driver circuit to switch to low voltage on the common output.

The ability of the driver circuit 102 to provide quick switching capabilities is exemplified by the graphs 151, 161 of FIGS. 4 and 5. The voltage curve 153 of FIG. 4 shows the voltage on the common output 107 of the driver circuit 102 in order to switch the connected PiN/NiP diode 103 to the 'OFF' state. As is shown by the voltage curve 153, the driver circuit 102 is capable of switching to connect the high voltage input, which in this example is approximately 1,000 V, to the common output 107 within about 11 μsec. The voltage curve 163 of FIG. 5 shows the voltage on the common output 107 of the driver circuit 102 in order to switch the connected PiN/NiP diode 103 to the 'ON' state. As is shown by the voltage curve 163, the driver circuit 102 is capable of switching to connect the low voltage input, which in this example is approximately −12 V, to the common output 107 within about 9 μsec. Thus, an RF impedance matching network which includes EVCs and switching circuits, as described above, shows significant improvements as compared to an RF impedance matching network which includes VVCs.

Figure 6:
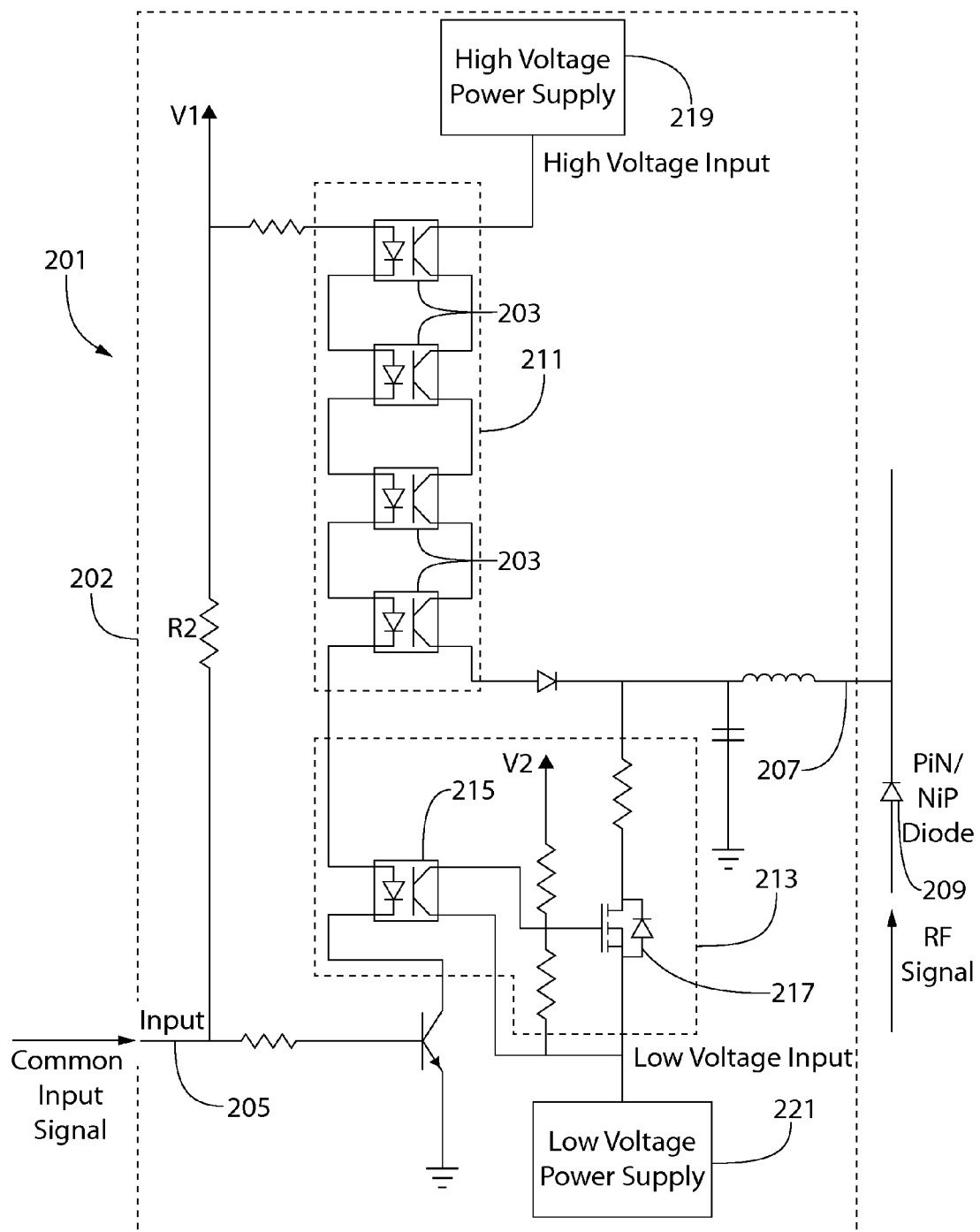
FIG. 6 illustrates a second switching circuit for use with an EVC.

A switching circuit 201 which includes a driver circuit 202 having multiple optocoupler phototransistors 203 to increase the high voltage capabilities is shown in FIG. 6. Like the driver circuit 102 of FIG. 3, this driver circuit 202 includes an input 205 which receives a common input signal for controlling the voltage on the common output 207. The switching circuit 201 includes a PiN/NiP diode 209 connected to the common output 207, and the voltage on the common output 207 may be used to switch the PiN/NiP diode 209 between 'ON' state and 'OFF' states. The input 205 is connected to both a first power switch 211, which includes the optocoupler phototransistors 203, and to a second power switch 213, which includes another optocoupler phototransistor 215 and a MOSFET 217.

A high voltage power supply 219 is connected to the first power switch 211, providing a high voltage input which is to be switchably connected to the common output 207. A low voltage power supply 221 is connected to the second power switch 213, providing a low voltage input which is also to be switchably connected to the common output 207.

The optocoupler phototransistors 203 of the first power switch 211 are connected in series to each other in order to enable the first power switch 211 to switch higher voltages onto the common output 207 in the same manner as discussed above with a single optocoupler phototransistor. With appropriate selection of the optocoupler phototransistors 203, the first power switch 211, as shown, is capable of switching about 1000 V or more from the high voltage power supply 219 to the common output 207. Additional optocoupler phototransistors may be added in series for the first power switch 211 to increase the high voltage switching capabilities. One of skill in the art will recognize that one or more optocoupler phototransistors may be connected in parallel to each other to increase the current load capabilities of the first power switch 211. One optocoupler phototransistor may be used to switch low voltages through the design rating of the optocoupler phototransistor, with more optocoupler phototransistors being added to switch higher voltages.

The optocoupler phototransistor 215 of the second power switch 213 receives the common input signal, like the optocoupler phototransistors 203 of the first power switch 211. This optocoupler phototransistor 215 is connected to the MOSFET 217 and places the MOSFET 217 in the 'off' state by connecting the source to the gate when the common input signal places the first power switch 211 in the 'on' state. In this configuration, when the MOSFET 217 is in the 'on' state, the second power switch 213 is also in the 'on' state, connecting the low power input to the common output 207. Likewise, when the MOSFET 217 is in the 'off' state, the second power switch 213 is also in the 'off' state, so that the low power input is disconnected from the common output 207. When the first power switch is in the 'off' state, optocoupler phototransistor 215 disconnects the gate from the source, so that the MOSFET 217 placed in the 'on' state by the gate being connected to the voltage V2, which is an appropriate voltage for controlling the gate of the MOSFET 217.

Figure 7:
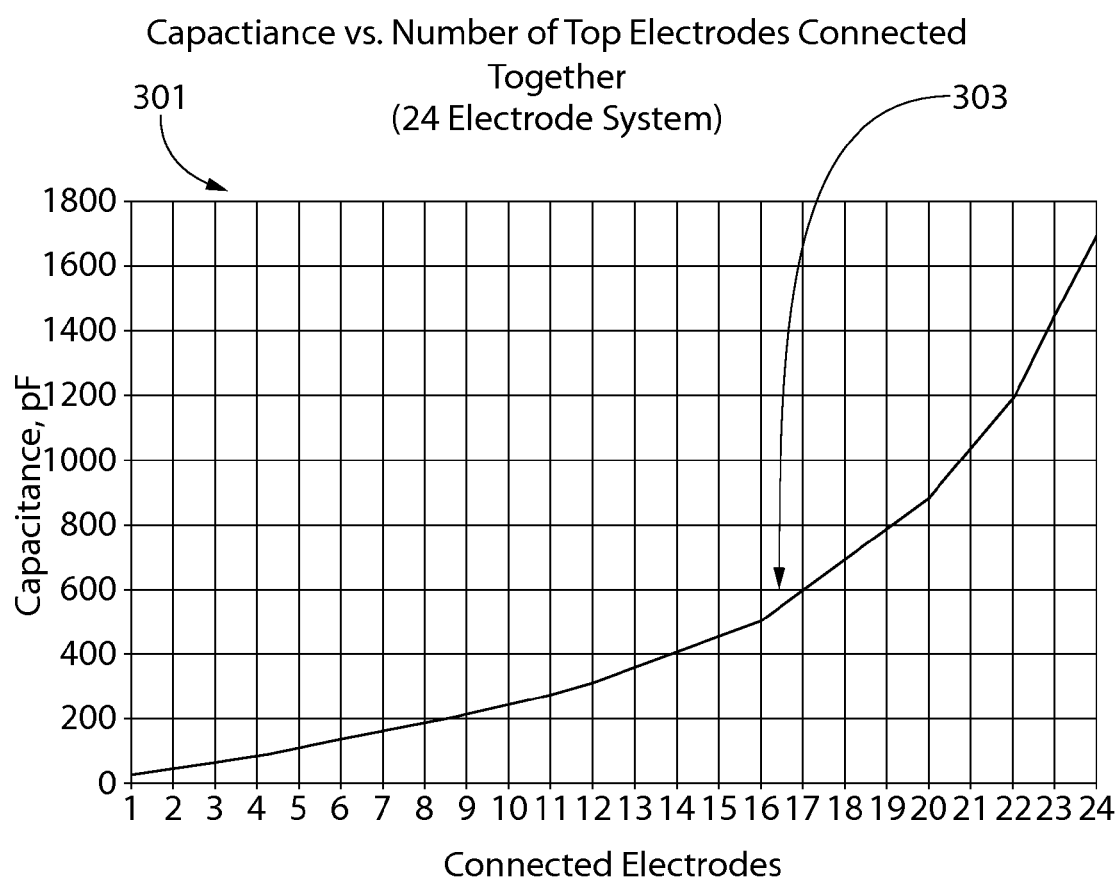
FIG. 7 is a graph showing the capacitance range of an EVC.

The non-linear capacitance range of a single EVC switched by a switching circuit is shown in the graph 301 of FIG. 7. The single EVC used to generate the capacitance curve 303 has 24 discrete capacitors in the manner described above, with the top electrodes of the discrete capacitors being selectively connected to arrive at the capacitance curve 303 shown. As can be seen, the single EVC may provide a capacitance ranging from only one active discrete capacitor (i.e., none of the top electrodes of any of the discrete capacitors are connected, so that the RF signal only flows through a single discrete capacitor) to all 24 discrete capacitors being active (i.e., all the top electrodes of all the discrete capacitors are connected). Any number of the 24 discrete capacitors may be connected, so that the capacitance of the single EVC may range from a low capacitance, with one active discrete capacitor, to a high capacitance, with all 24 discrete capacitors active. The low capacitance and the high capacitance are a matter of design choice for the EVC. In the capacitance curve shown, the low capacitance is about 25 pF, while the high capacitance is over 1,600 pF. The number of discrete capacitance values that is achievable between the low capacitance and the high capacitance is also a matter of design choice for the EVC, as more or fewer discrete capacitors may be included as part of the EVC. The only significant constraints on an EVC are the mechanical limitations posed by specific implementations (e.g., size or weight restrictions on the EVC). Mechanical limitations aside, an EVC does not appear to have any issues for achieving high value capacitance (e.g., 200,000 pF or higher).

Figure 8:
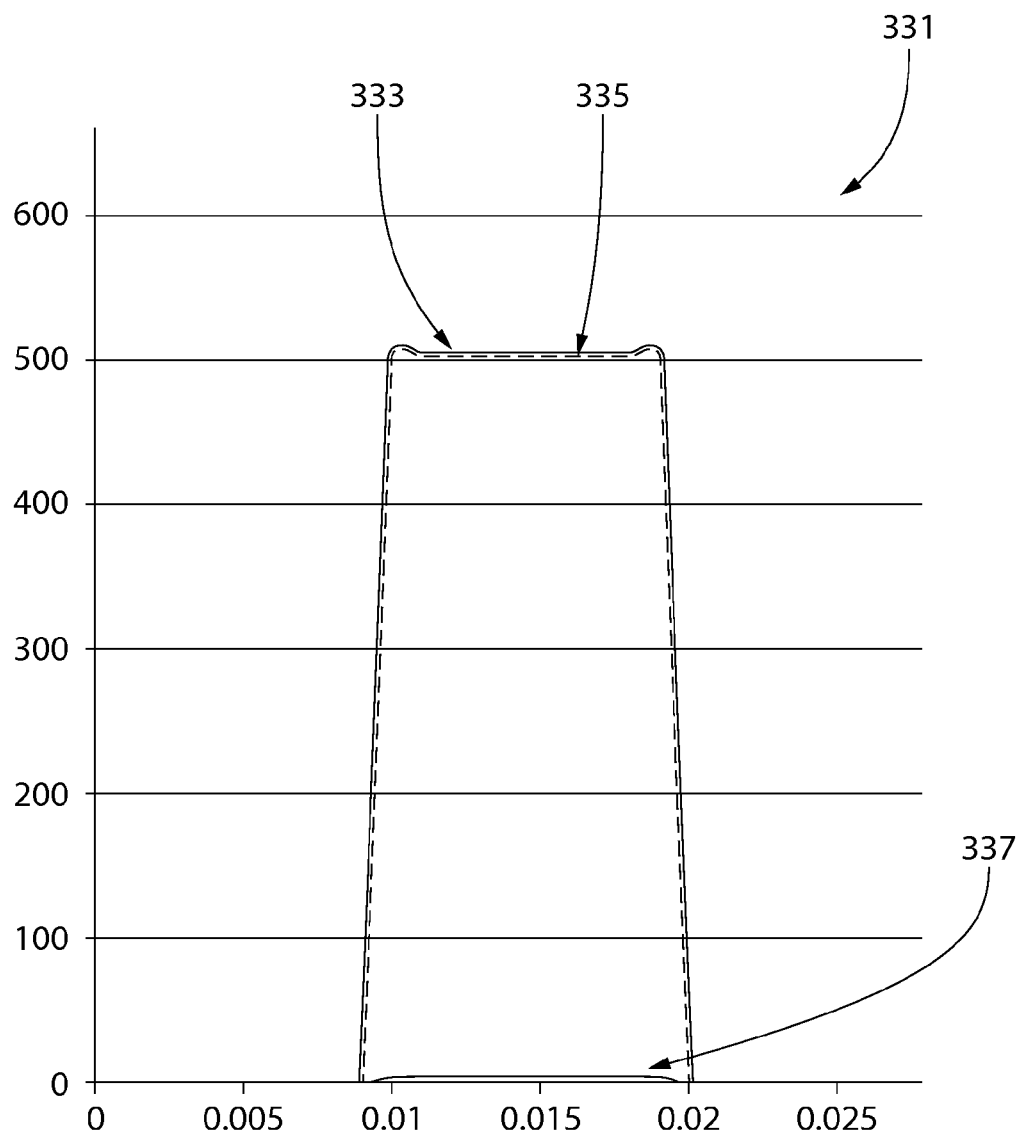
FIG. 8 is a graph showing the stable delivered power and the low reflected power that an impedance matching network including EVCs may provide during tuning.

The stable delivered power of an RF impedance matching network incorporating EVCs is shown in the graph 331 of FIG. 8, which does not show or take into account switching capabilities of an EVC controlled by a switching circuit. There are three curves shown in this graph 331: the output power 333 of the RF signal output from the RF source, which is about 500 V; the delivered power 335 to the plasma chamber; and the reflected power 337 back to the RF source. The output power 333 is a little over 500 V, while the reflected power 337 is in the range of about 10 V, so that the delivered power 335 to the plasma chamber is about 500 V. Not only is the delivered power 335 about 98% of the output power 333, but the delivered power 335, as can be seen, is substantially stable, without significant fluctuations. Both the percentage of delivered power 335 and the stability of the delivered power 335 represent significant improvements over an RF impedance matching network that is based on VVCs.

Figure 9:
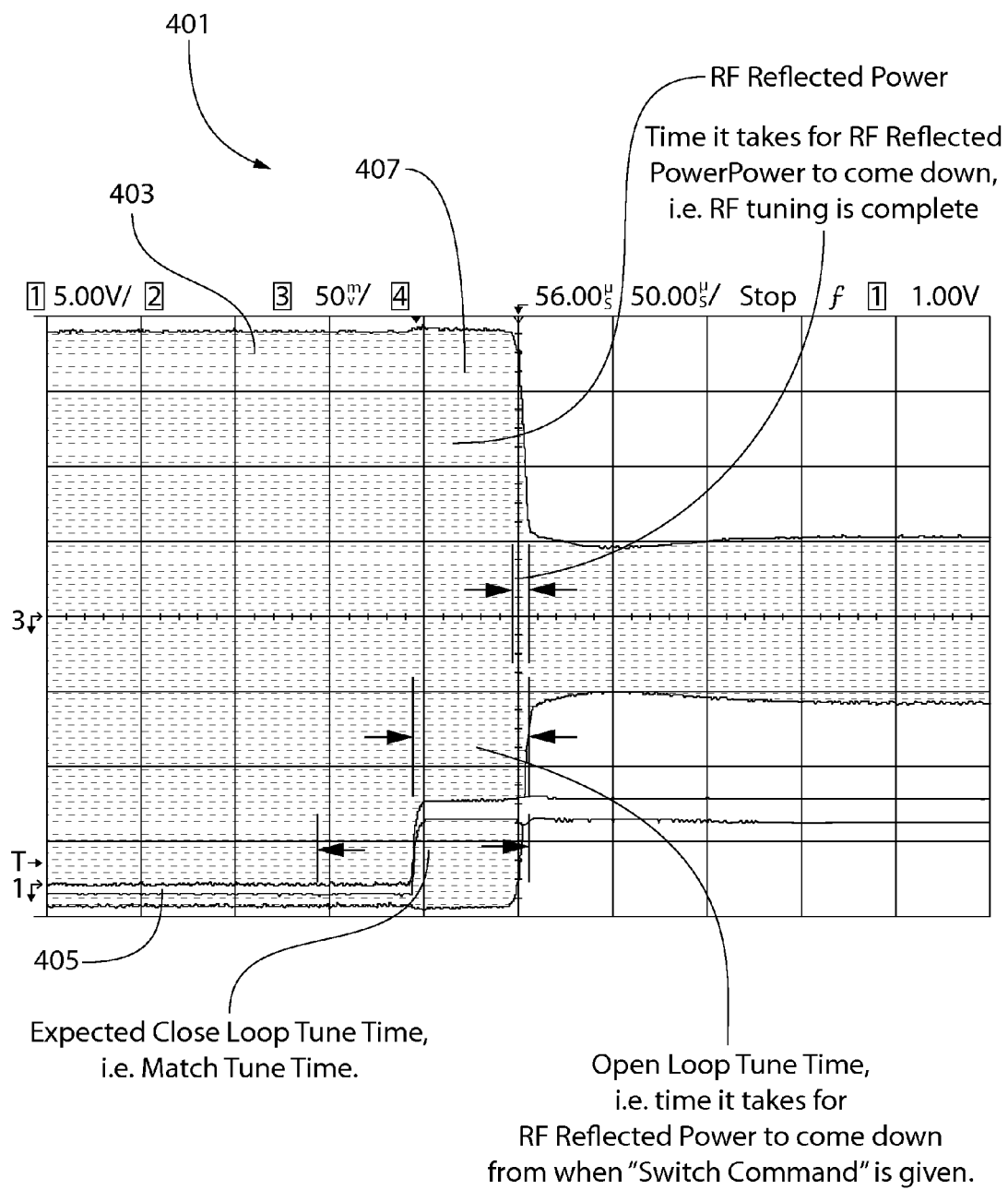
FIG. 9 is a graphical representation showing the reflected RF power profile through an RF impedance matching network using EVCs and showing the voltage supplied to the driver circuit for the EVCs.

When the switching capabilities of an EVC controlled by a switching circuit, in the manner described above, are incorporated into an RF impedance matching network, high speed switching is enabled for the RF impedance matching network. FIG. 9 is a graph 401 having voltage along the two y-axes and time along the x-axis to show the speed at which an RF impedance matching network using EVCs performs impedance matching (also referred to as the "match tune process"). A representation of an RF power profile 403 is shown, taken at the RF input of an RF impedance matching network, and the y-axis for the RF power profile has 50 mV divisions. A representation of the voltage of the common input signal 405 for driver circuits is also shown in the lower portion of the graph 401, the common input signal 405 originating from the control circuit of the RF impedance matching network, and the y-axis for the common input signal 405 has 5 V divisions. The x-axis has 50 μsec divisions, with the 56 μsec point marked in approximately the middle of the graph and the t=0 point as marked.

Initially, a significant amount of reflected power 407 is shown in the left portion of the RF power profile 403 (i.e., before the 56 μsec mark). This reflected power represents inefficiencies in the RF power being transferred between the RF source and the plasma chamber as a result of an impedance mismatch. At about t=−36 μsec, the match tune process begins. The first approximately 50 μsec of the match tune process is consumed by measurements and calculations performed by the control circuit in order to determine new values for the variable capacitances of one or both of the series and shunt EVCs.

Figure 10:
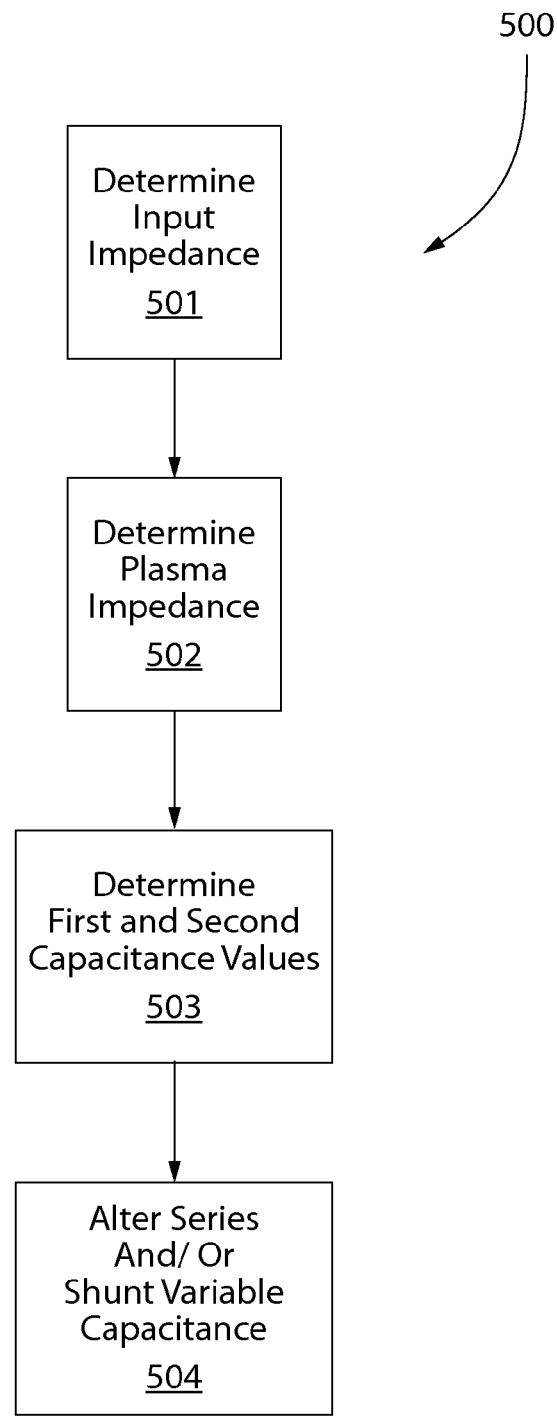
FIG. 10 is a flow chart showing an embodiment of a process for matching an impedance.

FIG. 10 is a flow chart showing a process 500 for matching an impedance according to one embodiment. Similar to the matching networks discussed above, the matching network 11 of the exemplified process includes the following (shown in FIG. 1): an RF input 13 configured to operably couple to an RF source 15, the RF source 15 having a fixed RF source impedance (e.g., 50 Ohms); an RF output 17 configured to operably couple to a plasma chamber 19, the plasma chamber 19 having a variable plasma impedance; a series electronically variable capacitor ("series EVC") 31 having a series variable capacitance, the series EVC 31 electrically coupled in series between the RF input 13 and the RF output 17; a shunt electronically variable capacitor ("shunt EVC") 33 having a shunt variable capacitance, the shunt EVC 33 electrically coupled in parallel between a ground 40 and one of the RF input 13 and the RF output 17; an RF input sensor 21 operably coupled to the RF input 13, the RF input sensor 21 configured to detect an RF input parameter at the RF input 13; an RF output sensor 49 operably coupled to the RF output, the RF output sensor configured to detect an RF output parameter; and a control circuit 45 operatively coupled to the series EVC 31 and to the shunt EVC 33 to control the series variable capacitance and the shunt variable capacitance. The steps of the exemplified process 500 can be carried out as part of the manufacture of a semiconductor, where a substrate 27 is placed in a plasma chamber 19 configured to deposit a material layer onto the substrate 27 or etch a material layer from the substrate 27, and plasma is energized within the plasma chamber 19 by coupling RF power from the RF source 15 into the plasma chamber 19 to perform a deposition or etching.

In the first step of the exemplified process 500 of FIG. 10, an input impedance at the RF input 13 is determined (step 501). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502). In one embodiment, the plasma impedance determination is based on the input impedance (determined in step 501), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504). This is done at approximately t=−5 μsec. The control signal instructs the switching circuit 101 (FIG. 3) to alter the variable capacitance of one or both of the series and shunt EVCs 31, 33.

This alteration of the EVCs 31, 33 takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

Using an RF matching network 11, such as that shown in FIG. 1, the input impedance can be represented as follows:

$$Z_{in} = \frac{(Z_P + Z_L + Z_{series})Z_{shunt}}{Z_P + Z_L + Z_{series} + Z_{shunt}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z_{in}'$) (which is typically 50 Ohms), and the known series inductor impedance ($Z_L$), the system can determine a new series EVC impedance ($Z_{series}'$) and shunt EVC impedance ($Z_{shunt}'$).

$$Z_{in}' = \frac{(Z_P + Z_L + Z_{series}')Z_{shunt}'}{Z_P + Z_L + Z_{series}' + Z_{shunt}'}$$

Based on the newly calculated series EVC variable impedance ($Z_{series}'$) and shunt EVC variable impedance ($Z_{shunt}'$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

This exemplified method of computing the desired first and second capacitance values and reaching those values in one step is significantly faster than moving the two EVCs step-by-step to bring either the error signals to zero, or to bring the reflected power/reflection coefficient to a minimum. In semiconductor plasma processing, where a faster tuning scheme is desired, this approach provides a significant improvement in matching network tune speed.

From the beginning of the match tune process, which starts with the control circuit determining the variable impedance of the plasma chamber and determining the series and shunt variable capacitances, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the variable capacitances of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 in$^3$ | 75 in$^3$ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 μsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

Figure 11:
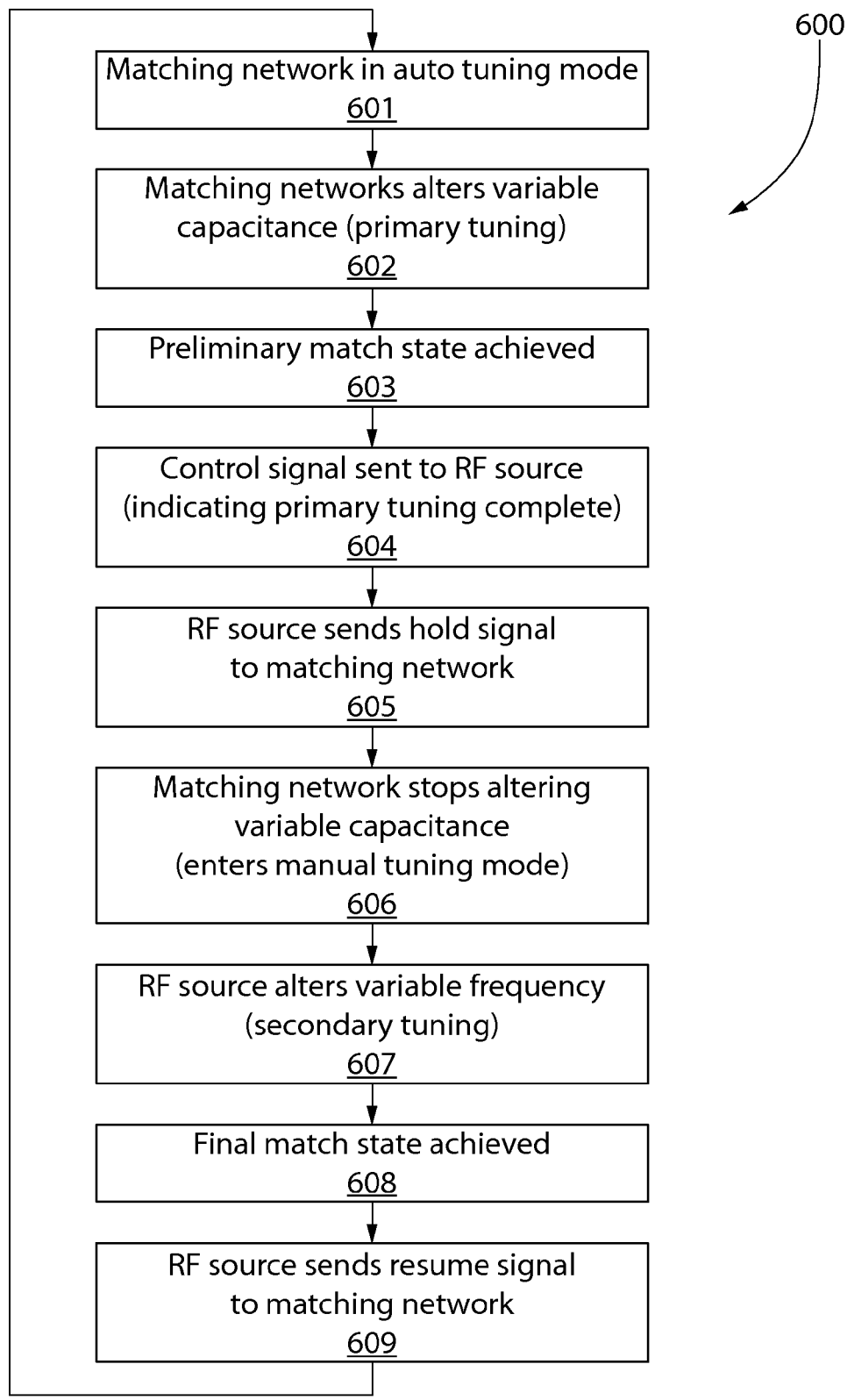
FIG. 11 is flow chart showing another embodiment of a process for matching an impedance.

FIG. 11 is a flow chart showing a process 600 for matching an impedance according to another embodiment. Since EVCs can provide only discretized capacitance values, a matching network that varies only EVCs to create an impedance match can only match based on these discretized values. For example, if a plasma impedance occurs such that the series and/or shunt capacitance values needed to bring the input impedance of the matching network to a desired non-reactive 50 Ohms lies in-between the discretized values, the EVC-based matching network will not be able to tune the input impedance of the matching network to the non-reactive 50 Ohms. The process 600 of FIG. 11 addresses such a circumstance by also altering a frequency of the RF source (sometimes referred to as the "RF generator") to carry out the impedance match.

The RF source, matching network, and plasma chamber of process 600 can be configured similarly to the system of FIG. 1. Accordingly, reference will be made to the components of the system of FIG. 1, though this figure represents just one embodiment of the invention.

As with previously discussed embodiments, the matching network 11 of process 600 can include an RF input 13 configured to receive an RF signal from an RF source 15, and an RF output 17 configured to operably couple to a plasma chamber 19. The matching network can further include at least one EVC 31, 33, and a control circuit 45 for instructing the at least one EVC 31, 33 to alter its variable capacitance. The RF source 15 (including its control circuitry) and the RF matching network 11 can be in the same enclosure or separate enclosures.

In the process 600, the matching network 11 is initially in an auto tuning mode (step 601). In this mode, the matching network 11 can be configured to carry out automated tuning by altering at least one capacitance value in a manner similar to that described in the foregoing embodiments. In this mode, the process 600 performs tuning referred to as primary tuning (step 602). In the exemplified embodiment, the primary tuning includes altering the series and/or shunt capacitance values in an attempt to achieve an impedance match. In the exemplified embodiment, the desired input impedance (the desired impedance at the input of the matching network 11) is a fixed, non-reactive 50 Ohm, sometimes referred to as the RF source impedance. In other embodiments, the desired input impedance can be any other impedance value, and can be variable.

In the exemplified embodiment, the primary tuning will bring the input impedance relatively close to a non-reactive 50 Ohms, the matching network 11 being limited by the discretized capacitance values of the EVCs 31, 33. At this stage, a preliminary match is achieved (step 603). The preliminary match state will have an associated first reflection parameter value at the RF source output 15a (the RF source output 15a being connected to the matching network input 13). In the exemplified embodiment, the first reflection parameter value is a reflected power value. In other embodiments, the first reflection parameter value can be any reflection-related parameter associated with the preliminary match state. For example, the first reflection parameter value can be the reflection coefficient, which represents the ratio of the amplitude of the reflected wave to the incident wave, and is sometimes referred to as gamma. The first reflection parameter can be measured by sensor 21 at the RF source output 15a. In other embodiments, reflected power can be measured by a sensor or comparable device that is located proximate to the matching network input 13.

In one embodiment, the alteration of variable capacitance in auto tuning mode can include the steps of adjusting the variable capacitance, determining an intermediate reflection parameter value, and then reducing and/or increasing the variable capacitance based on the intermediate reflection parameter value. This process can be repeated such that there are several intermediate reflection parameter values, the adjustment of the one or more variable capacitances being based on these intermediate reflection parameter values. In other embodiments, the invention can omit the use of intermediate reflection parameter values.

Once the preliminary match state is achieved, the matching network 11 can provide a control signal to the RF source 15 indicating that primary tuning is complete and that a preliminary match has been achieved (step 604). The control signal can be any signal sufficient to provide indication that the preliminary match has been achieved.

In response, the RF source 15 can send a hold signal to the matching network 11 (step 605), the hold signal placing the matching network 11 in a manual tuning mode (step 606). In manual tuning mode, the matching network 11 will stop performing automated tuning (and therefore will not alter the variable capacitances) as long as the hold signal is present. In other embodiments, the matching network 11 can automatically enter manual tuning mode when the preliminary match has been achieved, and can return to auto tuning mode when receiving an instruction from the RF source 15.

Next, the variable frequency of the RF source 15 can be adjusted to perform secondary tuning (step 607). This secondary tuning can fine tune the input impedance of the matching network 1 to the desired non-reactive 50 Ohm, or other desired impedance, and can minimize the reflected power at the output of the RF source 15, thereby also decreasing the reflection coefficient. The RF source 15 can have standard control circuitry by which the frequency is varied and the signals discussed above are sent, received, and processed. The frequency can be altered by providing a command to a frequency generation circuit that forms part of the RF source, such as a Direct Digital Synthesizer.

Once the RF source 15 has completed altering the frequency for the secondary tuning, a final match state is achieved (step 608). The final match state will have an associated second reflection parameter value at the RF source output 15a. As with the first reflection parameter value, in the exemplified embodiment, the second reflection parameter value is a reflected power value. In other embodiments, the second reflection parameter value can be any reflection-related parameter associated with the preliminary match state, such as the reflection coefficient (discussed above). The second reflection parameter can be measured by a sensor 21 at the RF source output 15a. Since the final match state causes a more finely tuned match than the preliminary match state, the second reflection parameter value will be less than the first reflection parameter value.

The alteration of the variable RF source frequency can include reducing and/or increasing the variable RF source frequency based on an intermediate reflection parameter value. In one embodiment, the alteration of the variable source frequency includes reducing the variable RF source frequency by a first amount and determining the intermediate reflection parameter value at the RF source output. If the intermediate reflection parameter value decreases, the variable RF source frequency is again reduced by the first amount and a new intermediate reflection parameter value is measured. This process can repeat until the intermediate reflection parameter value increases. When the intermediate reflection parameter value increases, the variable source frequency can be increased by a second amount (the second amount being less than the first amount), and then a new intermediate reflection parameter value is determined. If the new intermediate reflection parameter value decreases, the variable source frequency is again increased by the second amount, and a new intermediate reflection parameter value is determined. This process can repeat until the new intermediate reflection parameter value increases or is zero, at which stage the process can stop or the variable source frequency can be returned to its previous value.

The invention is not limited to any one embodiment for tuning the frequency or variable capacitance. For example, the invention can use any variety of methods to step up and/or down the frequency in different increments based on the resulting reflected power. Further, the process 600 can have a minimum reflected parameter value (e.g., a minimum reflected power or minimum reflection coefficient). When the minimum reflected parameter value is achieved, the tuning can stop, regardless of whether the process is in primary or secondary tuning.

Returning to the exemplified embodiment, once the final match state is achieved, the RF source 15 can send a signal (sometimes referred to as a "resume signal") to the matching network 11 to place the matching network 11 back into auto tuning mode (step 609). The matching network 11 can then be ready for the next variation of the plasma impedance. Thus, when a plasma impedance of the plasma chamber 15 changes, the control circuit 45 can repeat the instruction to alter the variable capacitance and/or the instruction to alter the variable RF source frequency.

In other embodiments, the process 600 will not resume tuning until the reflection parameter value exceeds a predetermined value. Such a tuning restart threshold can be applied to the primary tuning, the secondary tuning, or both. Further, thresholds can be set such that, for small reflected power level raises, only secondary tuning is done (altering the RF source frequency), while, for larger reflected power levels, primary tuning is first carried out (altering capacitances), followed by secondary tuning (altering the RF source frequency).

Combining an EVC-based RF matching network with a variable frequency RF source provides several advantages for fast and precise RF matching. For example, with all components being electronic, the system has higher reliability than those using VVC technology, which are prone to mechanical failures. Further, the primary and second tuning can be performed quickly to enable matching within 500 μsec. Further, the combined EVC matching network and variable RF source can decrease the reflected power to the RF source to essentially 0 Watts.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A radio frequency (RF) impedance matching network comprising:
    an RF input configured to receive an RF signal from an RF source;
    an RF output configured to operably couple to a plasma chamber;
    at least one electronically variable capacitor (EVC) having a variable capacitance;
    a control circuit configured to:
        instruct the at least one EVC to alter the variable capacitance, the alteration of the variable capacitance causing the matching network to achieve a preliminary match state, the preliminary match state having an associated first reflection parameter value at an RF source output; and upon the achievement of the preliminary match state, instruct the RF source to alter a variable RF source frequency, the alteration of the variable RF source frequency causing achievement of a final match state, the final match state having an associated second reflection parameter value at the RF source output;

wherein the second reflection parameter value is less than the first reflection parameter value; and wherein, when a subsequent reflection parameter value at the RF source output exceeds a predetermined value, the control circuit again instructs the alteration of the variable capacitance and the variable RF source frequency.

2. The matching network of claim 1 wherein the first reflection parameter value and the second reflection parameter value are reflected power values.

3. The matching network of claim 1 further comprising a sensor configured to measure the first reflection parameter value at the RF source output and the second reflection parameter value at the RF source output.

4. The matching network of claim 1 wherein:
prior to achievement of the preliminary match state, the matching network is in an auto tuning mode in which the variable capacitance can be altered;
after achievement of the preliminary match state, the matching network is in a manual tuning mode in which the variable capacitance cannot be altered; and
after achievement of the final match state, the matching network re-enters the auto tuning mode.

5. The matching network of claim 4 wherein, during the alteration of the variable RF source frequency, the RF source sends a hold signal to the matching network, the hold signal instructing the matching network to remain in manual tuning mode.

6. The matching network of claim 5 wherein, after achievement of the final match state, the RF source sends a resume signal to the matching network, the resume signal instructing the matching network to re-enter auto tuning mode.

7. The matching network of claim 1 wherein, when a plasma impedance of the plasma chamber changes, the control circuit is further configured to repeat (a) the instruction to alter the variable capacitance and (b) the instruction to alter the variable RF source frequency.

8. The matching network of claim 1 wherein the at least one electronically variable capacitor comprises:
a series EVC having a series variable capacitance, the series EVC operably coupled in series between the RF input and the RF output; and
a shunt EVC having a shunt variable capacitance, the shunt EVC operably coupled in parallel between a ground and one of the RF input and the RF output;
wherein the alteration of the variable capacitance comprises altering at least one of the series variable capacitance and the shunt variable capacitance.

9. The matching network of claim 8 wherein the series EVC comprises a first plurality of capacitors, and the shunt EVC comprises a second plurality of capacitors.

10. The matching network of claim 9 wherein the matching network further comprises an inductor operably coupled in series between the RF input and the RF output.

11. The matching network of claim 10 wherein the control circuit is further configured to:

determine a variable plasma impedance of the plasma chamber; and determine a series capacitance value for the series variable capacitance and a shunt capacitance value for the shunt variable capacitance;

wherein the alteration of the variable capacitance comprises at least one of (a) altering the series variable capacitance to the series capacitance value and (b) altering the shunt variable capacitance to the shunt capacitance value.

12. The matching network of claim 11 wherein the alteration of the variable capacitance is caused by at least one of a plurality of switching circuits, wherein each of the plurality of switching circuits is configured to switch one capacitor of the first plurality of capacitors and the second plurality of capacitors.

13. The matching network of claim 12 wherein each switching circuit comprises:
an electronic switch electrically coupled to the one capacitor; and
a driver circuit having a common output electrically coupled to the electronic switch, the driver circuit comprising:
a first power switch receiving a common input signal and a first voltage and configured to switchably provide the first voltage to the common output in response to the common input signal, the first power switch comprising at least one optocoupler phototransistor; and
a second power switch receiving the common input signal and a second voltage and configured to switchably provide the second voltage to the common output in response to the common input signal, wherein:
the second voltage is opposite in polarity to the first voltage; and
the first power switch and the second power switch are configured to asynchronously provide the first voltage and the second voltage, respectively, to the common output in response to the common input signal, the electronic switch being switched according to the first voltage or the second voltage being provided to the common output.

14. The matching network of claim 1 wherein the alteration of the variable capacitance comprises reducing and/or increasing the variable capacitance based on an intermediate reflection parameter value.

15. The matching network of claim 1 wherein the alteration of the variable RF source frequency comprises reducing and/or increasing the variable RF source frequency based on an intermediate reflection parameter value.

16. The matching network of claim 15 wherein the variable RF source frequency is reduced and/or increased by a first amount and by a second amount, wherein the second amount is less than the first amount.

17. The matching network of claim 16 wherein the alteration of the variable source frequency comprises:
a) reducing the variable RF source frequency by a first amount;
b) determining the intermediate reflection parameter value at the RF source output;
c) if the intermediate reflection parameter value decreases, repeating steps a) and b;
d) if the intermediate reflection parameter value increases:
i) increasing the variable source frequency by the second amount;

ii) determining a new intermediate reflection parameter value; and iii) if the new intermediate reflection parameter value decreases, repeating steps i) and ii).

18. A method of impedance matching comprising:

operably coupling an RF source to an impedance matching network;

operably coupling the matching network to a plasma chamber;

altering a variable capacitance of at least one electronically variable capacitor (EVC) of the matching network, the alteration of the variable capacitance causing achievement of a preliminary match state, the preliminary match state having an associated first reflection parameter value at an RF source output;

upon the achievement of the preliminary match state, altering a variable RF source frequency of the RF source, the alteration of the variable RF source frequency causing a final match state, the final match state having an associated second reflection parameter value at the RF source output, wherein the second reflection parameter value is less than the first reflection parameter value; and when a subsequent reflection parameter value at the RF source output exceeds a predetermined value, again altering the variable capacitance and the variable RF source frequency.

19. The method of claim 18 wherein:

prior to achievement of the preliminary match state, the matching network is in an auto tuning mode in which the variable capacitance can be altered;

after achievement of the preliminary match state, the matching network is in a manual tuning mode in which the variable capacitance cannot be altered; and after achievement of the final match state, the matching network re-enters the auto tuning mode.

20. A method of manufacturing a semiconductor comprising:

placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma:

operably coupling the RF source to an impedance matching network;

operably coupling the matching network to the plasma chamber;

altering a variable capacitance of at least one electronically variable capacitor (EVC) of the matching network, the alteration of the variable capacitance causing achievement of a preliminary match state, the preliminary match state having an associated first reflection parameter value at an RF source output;

upon the achievement of the preliminary match state, altering a variable RF source frequency of the RF source, the alteration of the variable RF source frequency causing a final match state, the final match state having an associated second reflection parameter value at the RF source output, wherein the second reflection parameter value is less than the first reflection parameter value; and when a subsequent reflection parameter value at the RF source output exceeds a predetermined value, again altering the variable capacitance and the variable RF source frequency.

* * * * *